(12) United States Patent  (10) Patent No.: US 8,082,805 B2
Kisker  (45) Date of Patent: Dec. 27, 2011

(54) MAGNETIC SENSOR ASSEMBLY

(76) Inventor: Erhard Kisker, Düsseldorf (DE)

( * ) Notice: Subject to any disclaimer, the term of this patent is extended or adjusted under 35 U.S.C. 154(b) by 856 days.

(21) Appl. No.: 12/091,980

(22) PCT Filed: Oct. 31, 2006

(86) PCT No.: PCT/EP2006/010447
§ 371 (c)(1),
(2), (4) Date: May 20, 2008

(87) PCT Pub. No.: WO2007/051589
PCT Pub. Date: May 10, 2007

(65) Prior Publication Data
US 2008/0295611 A1  Dec. 4, 2008

(30) Foreign Application Priority Data
Nov. 3, 2005 (DE) .......................... 10 2005 052 906

(51) Int. Cl.
*G01L 3/00* (2006.01)
*G01L 1/12* (2006.01)
(52) U.S. Cl. ................. 73/862.333; 335/296; 73/862.69
(58) Field of Classification Search ............. 73/862.333, 73/862.335, 862.336, 862.69; 335/215, 296
See application file for complete search history.

(56) References Cited

U.S. PATENT DOCUMENTS

| 3,932,112 A | 1/1976 | Garshelis | 431/255 |
| 5,870,328 A | 2/1999 | Mohri | 365/135 |
| 2002/0029642 A1 | 3/2002 | Soejima et al. | 73/862.08 |

OTHER PUBLICATIONS

English Translation of the Written Opinion of the International Search Authority for PCT/EP2006/010447. Jun. 11, 2008.*
Blanco J M et al:"Influence of AC Magnetic Field Amplitude on the Surface Magnetoimpedance Tensor in Amorphus Wire With Helical Magnetic Anisotropy", IEEE Transactions on Magnetics, IEEE Service Center, New York, vol. 40, No. 5 Sep. 2004, pp. 3368-3377.
Li Y F et al:"Torsion-dependent magnetoimpedence in FECUNbSiB nanocrystalline wires with vanishing or transverse anisotropy", Journal of Applied Physics, American Institute of Physics, New York, vol. 93, No. 12, Jun. 15, 2003, pp. 9839-9844, p. 5, right column, paragraph IV.
Zolfagharkhani G et al:"Detection and Control of Spin Transport by Nanomechanical Spin-Torsion Device" Physics Review, vol. 70, 2004.
Gonzales, J.M. et al:"Helical Magnetic Anisotropy induced by current annealing under torsion in amorphous wires", IEEE Transaction on Magnetics, vol. 26, No. 5, Sep. 1990, pp. 1798-1800.
Heinrich B et al:"Role of spin current in magnetic relaxations of metallic multilayer films", Journal of Magnetism and Magnetic Materials, 2003, pp. 258-259, 346-381.

* cited by examiner

*Primary Examiner* — Lisa Caputo
*Assistant Examiner* — Punam Roy
(74) *Attorney, Agent, or Firm* — Andrew Wilford

(57) ABSTRACT

A sensor assembly for measuring or detecting a magnetic field, torsion, or mechanical tension has a magnetic or magnetizable electrically conductive conductor having a first section and thereadjacent a second section in which a helical anisotropy is or can be generated. A dynamical helical magnetization is generated in the first conductor section a dynamic helical magnetization and is transferred to the second conductor section. A voltage in the second conductor section that is generated by the transfer of magnetization from the first conductor section is detected.

18 Claims, 15 Drawing Sheets

MAGNETIC SENSOR ASSEMBLY

CROSS REFERENCE TO RELATED APPLICATIONS

This application is the US national phase of PCT application PCT/EP2006/010447, filed 31 Oct. 2006, published 10 May 2007 as WO 2007/051589, and claiming the priority of German patent application 102005052906.2 itself filed 3 Nov. 2005, whose entire disclosures are herewith incorporated by reference.

FIELD OF THE INVENTION

The invention concerns a sensor assembly, in particular for the measurement or detection of magnetic fields and/or torsions and/or mechanical tensions. The invention furthermore concerns a method of detecting or measuring these physical parameters.

Basically, sensors for detecting and/or measuring of such physical parameters are known in the art. A problem with the known sensor arrangements is that they often are not highly integratable (miniaturizable) and also are trouble-prone.

OBJECT OF THE INVENTION

The object of the invention is to provide a sensor assembly and a detection method or measurement method for magnetic fields, torsions or tractions or mechanical deformations that is distinguished by a low susceptibility to interference, high sensitivity, selectivity and high integrability.

SUMMARY OF THE INVENTION

This object is attained by a sensor assembly comprising a magnetizable or magnetic, particularly soft magnetic electrically conductive conductor itself comprising a first conductor section in which a dynamic helical magnetization can be generated, and at least one second conductor part in which a helical anisotropy is produced or can be produced, whereby magnetization can be transferred from the first into the second conductor section, in particular by spin transfer and can be detected by a voltage induced in the second conductor section due to the transfer of the magnetization.

In addition the object is further attained by a method in which a dynamic, particularly helical, magnetization is generated in a first section of a magnetizable or magnetic, in particular soft magnetic electrically conductive conductor and a particularly quasi-static, particularly helical, anisotropy is or can be generated in at least one second section of the conductor, whereby magnetization is transferred from the first into the second section of the conductor and is detected by means of a voltage generated due to the transfer of the magnetization.

The essential core idea behind the invention is to provide a sensor signal, here a measurable voltage whose size, course and/or shape depends on the magnetic states of the above-described conductor sections, whereby the magnetic states, particularly the actual magnetizations, depend on external influences, such as magnetic fields, tensile stresses or torsions, to which one or more of the conductor sections are exposed at the time of detecting the measurable quantity, i.e. the voltage.

The provision of such a voltage signal is due to a spin transfer that occurs from the above-described first conductor section into at least the second conductor section.

Such spin transfer is the result of magnetic excitation in the first conductor section that extends into the second conductor section, i.e. is transferred there and can be detected there. This excitation preferably is generated in such way that a dynamic, helical, magnetization is generated in the first conductor section that can be achieved particularly by superposing an external magnetic field in which at least the first conductor section is located with a magnetic field that can be generated by a current in the first conductor section. Thus the current essentially generates a magnetic field that follows the cross-section of the geometry of the conductor assembly, particularly a circular magnetic field, where an external magnetic field preferably has a component in the direction of the first conductor section. The superposition results in a magnetization in the first conductor section with, at least along the direction of this conductor section, a helical component.

An external magnetic field can e.g. be produced with help of a coil arrangement or by the stray field of a permanently magnetized material that is in immediate proximity to the first conductor section. Also local magnetic fields in any direction influence the measured voltage, which is also technically exploitable.

To achieve a dynamic of the helical magnetization, at least one of the two overlapping magnetic fields can be variable with time, preferably the magnetic field generated by a current through first conductor section. This is achievable by a current variable with respect to time, for example an (particularly sinusoidal) AC current or a current pulse of arbitrary shape.

Thus according to one embodiment a current in the first conductor section is generated by a voltage pulse, in particular a rectangular or trapezoidal voltage pulse applied along the first conductor section. Hereby preferably the rise and/or fall times of a flank of a current pulse can be in the range from 1 to 150 nanoseconds, preferably 5 to 20 nanoseconds, in particular 15 nanoseconds. In particular, these longer rise times of the flanks lead to less oscillations in the measured voltage signal along the second conductor section, which is beneficial particularly in the presence of an electrical mismatch in the application of stimulating voltage to the first conductor section. Thus the time length of the flanks of the stimulating current pulse are chosen preferably such that oscillations in the measured voltage signal are reduced, in particular avoided.

A dynamic helical magnetization in the first conductor section creates a "shake-up" of the spin system and the disappearance of the potential domain wall pinning and facilitates due to the dynamics spin transfer that is detectable, since the magnetization in the second conductor section changes dynamically.

In all embodiments of the invention the spin transfer and the detected voltage in the second conductor section depends on the magnetic properties of both conductor sections, such that, with given magnetic properties in one of the conductor sections, a measured voltage allows one to draw conclusions on the magnetic state of another conductor section.

An especially effective spin transfer or originating voltage or transfer of the magnetization from the first into the second conductor section can be achieved if in the second conductor section a helical anisotropy dominates, in particular if the anisotropy with respect to its spatial form corresponds at least to one component of the spatial form of the generated helical magnetization in the first conductor section.

Thus the measured voltage signal in particular depends on this kind of matching and is variable by a change of this matching. The spin-flow strength between the conductor sections thus will largely be affected by their magnetic properties.

Since external magnetic fields as well as mechanical deformations and/or torsions to which one conductor section is exposed influences the present matching, the possibility arises to make conclusions on these interacting physical parameters by means of the measurement of the voltage, so that an arrangement according to invention can be employed as sensor for these parameters.

In the preferred and constructive simple arrangement the first conductor section can be created between a first and a second contact on the conductor assembly and the second conductor section between a third and a fourth electric contact on the conductor assembly. In addition the first and the second conductor section do not have a the same sectional shape. This way an especially distortion-free four-point measurement is made possible, especially without a current or voltage in the first conductor section directly influencing the voltage along the second conductor section.

Between the first and second electrical contact a time-varying voltage can be applied from the outside, e.g. a sinusoidal voltage or a rectangular or a trapezoidal-pulsed voltage. By means of this voltage a current is generated within the first conducting section and creates the desired helical magnetization. Between the third and the fourth contact the measured voltage can be taken to determine the transferred magnetization.

In this arrangement as a conductor assembly, for instance a wire of arbitrary cross section, preferably a micro wire or a thin strip, can be chosen. Here the first and second conductor sections can be electrically connected by means of the same element.

In a different arrangement the first conductor section is electrically separated from the second conductor section. As a result a direct galvanic influence of the voltages is excluded. An effective transfer of the magnetization between the conductor sections is to be understood here in that the first conductor section acts as a helical transmitter and the signal is received by the second conductor section as a helically matched antenna.

According to one realization of the sensor assembly in accordance with the invention, for efficient spin diffusion into the magnetic or magnetizable material of the second conductor section, the torsion status can be crucial since mechanical torsion can induce a helical anisotropy, particularly in combination with an external magnetic field, in which also the second conductor section can be present or particularly in combination with special material properties of the material used for the conductor sections that can contribute to a anisotropy when torqued. Thus it was realized that a twist or rotational deformation of a soft magnetic strip or wire generates a helical magnetic anisotropy. For the two opposite rotation directions different screw directions of the helical magnetic anisotropy result.

Thus with the method according to invention upon a given helical magnetization in the first conductor section by means of the measurable voltage flowing in the second conductor section, a magnitude and/or a direction of a torsion of the second conductor section can be measured. Here the helical magnetization in the first conductor section can be provided by the choice of the external magnetic field and of a current, particularly a current pulse, and can be known. The arrangement according to invention therefore is suited for use as a torsion sensor.

Because of the steep current pulse the first conductor section provides magnetic excitation in the rising and falling flank. The helical magnetic anisotropy in the second conductor section according to the above embodiment determines the excitation depending on the matching from the first conductor section, which e.g. leads to different signs of the measured voltage pulses for opposite helical anisotropy of the second conductor section.

In an additional arrangement it might also be provided that one of the conductor sections, particularly the second conductor section, has a static helical anisotropy.

Thus the helical anisotropy is imparted in particular in the second conductor section during the manufacturing process. It might e.g., be statically impressed by suitable heat treatment (annealing) of a, where appropriate, twisted conductor section with or without a magnetic field or current flow. Instead of twisting the material during annealing also the helicity of domain walls can be set by annealing without an external magnetic field. This makes possible the automation of the production process and potentially the large-scale integration of the sensors described here, for instance for applications in magnetic random-access-memories (M-RAMs).

For instance, with a fixed helical anisotropy of the second conductor section, the combination of the pulse direction and flank direction, and magnetic field direction, it is possible to distinguish logical states, the logical state being given by the magnetic field's presence, magnitude, or direction. Hence, particularly in the surroundings of the first conductor section, where appropriate, in the surroundings of the whole sensor assembly, an external magnetic field is present (e.g. earth field) and the voltage measured in the second conductor section is different from that when no external magnetic field or a magnetic field with different direction or magnitude is present. Thus the sensor assembly, in particular with high integration, can be employed as a reading device for a magnetic memory disk, where a magnetic field represents a logical state. Also, magnetic field can be related applied current pulse logical states.

For instance this can be achieved by juxtaposing with the conductor section a magnetic or magnetizable element, particularly a permanent magnet or a magnetized element. For instance this might be a magnetizable memory disk with regions having different magnetizations that can be interrogated with a sensor according to invention with a probing "read"-current pulse passing through the first conductor section and a voltage pulse being measured at the second conductor section that represents the result of the readout of the corresponding memory region.

Likewise the sensor assembly also itself can serve as a readable memory element, if the helical anisotropy in the second conductor section is influenced from outside. Thus for instance logical states then can be stored and read out. This presupposes that the sensor assembly contains means for changing of helical anisotropy in the second conductor section.

In one embodiment of the invention the first and the second conductor sections are linearly arranged one behind the other, so it is possible to provide several second conductor sections, for instance in linear arrangement to both sides of the first conductor section.

In another embodiment the first and at least one second conductor section can be arranged at an angle to each other, particularly at a right angle to each other. Also, two or more second conductor sections can be mounted linearly one behind the other and at an angle, particularly at a right angle with the first conductor section. Principally the above-described embodiments can also arbitrarily be combined.

It is advantageous with several second conductor sections that a voltage signal from the second conductor section can be used as a reference signal for a signal that is gained from one or several other second conductor sections. Thereby in particular disturbances such as influences from unwanted magnetic fields (earth magnetic field) can be excluded by a reference comparison, since such a disturbing magnetic field also acts with respect to a measurement of the reference voltage.

In a further alternative or also cumulative embodiment a further conductor section to which a steering voltage is applied or applicable can be mounted between the first and the second conductor section, the measurable voltage along the second conductor section depending on the steering voltage. In this manner a magnetic switch is created.

For instance between two conductor sections an additional contact pair can be provided in order to apply a voltage there such that a current flows through the corresponding conductor element. The thereby caused disturbance of the spin transfer unhindered at zero voltage influences the magnitude of the voltage signal in the second conductor section.

Besides the possibility of having a pulsed current flowing in the first conductor section by application of an exciting pulsed voltage there is also the possibility of applying an exciting periodic sinusoidal voltage to the first conductor section. Thereby also in the measured voltage that is measurable along the second conductor section is a periodic sinusoidal voltage whose phase of which is variable with respect to the exciting voltage and depends on the magnetic states in the conductor sections. For instance by a torsion that changes a magnetic state in the second conductor section can change the phase position. Thus an arrangement according to invention can also be used as a phase shifter where a change of the magnetic states not only can be caused by torsion but also by all of the previously described procedures.

As materials for forming a conductor assembly, soft magnetic amorphous materials and in particular iron- or preferably cobalt-based materials are used that also are referred to as metallic glasses. The following materials for instance may be used: Co70/Si+B23/Mn5/Fe+Mo2 or CO66/Si15/B14/Fe4/Ni1. Also other magnetic alloys can be used.

A sensor according to invention is distinguished in summary in that tension or torsion can be measured in magnitude and direction (a) or with impressed torsion (in general: impressed helical anisotropy) a conclusion on an external magnetic field superimposed on the sensor can be drawn in magnitude and direction (b). Mode (b) is particularly suited as a sensitive magnetic field sensor.

The sensor is distinguishable from other sensors on a magnetic base (magneto resistance- or magneto impedance-based) in that the voltage uses as measurement voltage is free from system-dependent background or opposite to inverse Wiedemann-effect based magnetic field- or mechanical tension or torsion sensors due to the absence of a pickup coil needed there.

Therefore in usage by means of the invention a sensor structure is possible that is simpler in production and highly integratable. In cooperation of mechanical on the sensor material acting parameters such as torsion and/or tension with magnetic parameters (superimposed magnetic field) and electrical operational parameters such as the current through the first conductor section in direction, magnitude and pulse- or waveform, a voltage originates in the second conductor section that depends reproducibly on these parameters and serves as the readout measurement.

BRIEF DESCRIPTION OF THE DRAWING

The figures show preferred embodiments of the invention. Therein.

DETAILED DESCRIPTION

Figure 1:
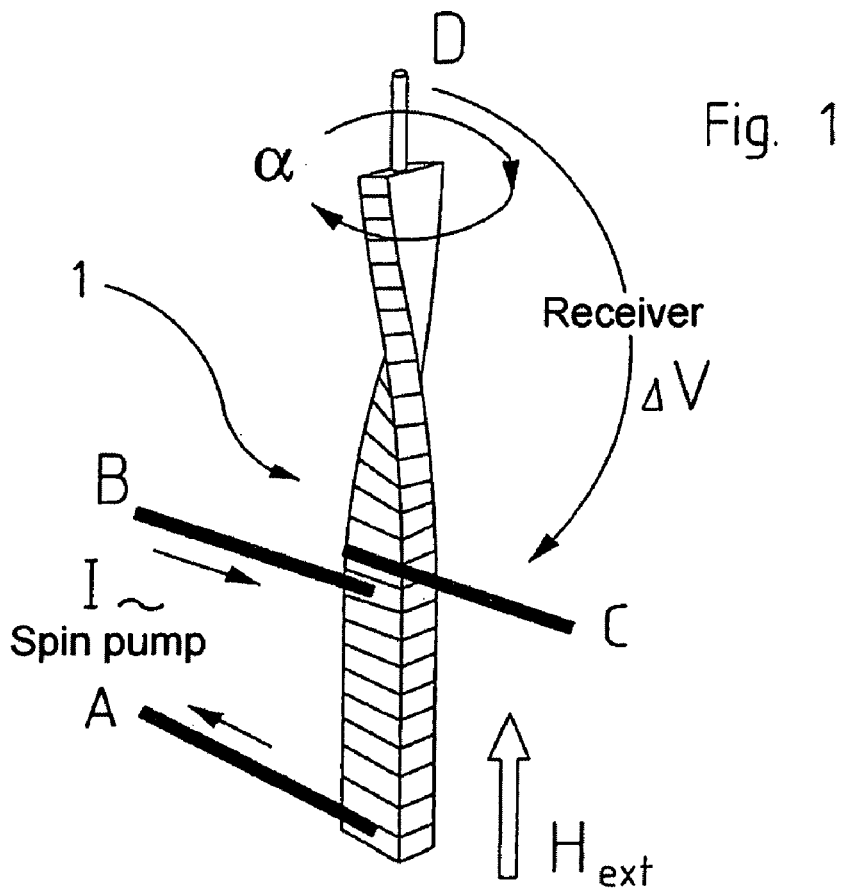
FIG. 1 shows a sensor according to invention serving as a torsion or magnetic field sensor with a linear arrangement of first and second conductor sections.

FIG. 1 schematically shows a sensor according to invention. The crucial element of the sensor can be a thin strip of (soft) magnetic material. In one embodiment, a thin strip mounted laterally on a substrate and having a thickness for instance less than 100 micrometers or a micro wire, in another embodiment a cylindrical body extending perpendicular to a substrate can be provided. Also thin, for instance vapor-deposited films can be used.

In the FIG. 1 the first design is illustrated. The sensor is divided functionally into two sections. A for instance homogeneous soft magnetic strip 1 is separated by contacts into two electrical regions that are located between contacts A, B and C, D. The section between the contacts A and B constitutes the first conductor section that can be designated here because of its function also as the "spin pump" and the part between C and D constitutes the second conductor section, also referred to as the receiver.

The sensor is supported for instance by a substrate plate. The plate can be rigid underneath the spin pump. In the region of the receiver the substrate plate has to be sufficiently flexible to enable twisting. If only small torques are provided, the receiver might also be freely attached between the connections B and C, where the lead D for instance can be connected rigidly with a mounting plate of the spin pump. Because of a length decrease during twisting the position of the connection D is variable in position, particularly with respect to a mounting plate of the spin pump.

A possible substrate might consist of an electrically insulating material. It can serve to carry the sensor and all electrical connections mechanically stable. It is at least as large as the spin pump and is rigid in the region underneath the spin pump and to elastic in the region underneath the receiver. The connections of the receiver are wires that are flexible so as not to hinder twisting. This for instance can be provided by adding a short loop in each of the wires.

The contacts B and C preferably do not touch each other to enable a genuine four-point measurement.

The feature of this sensor is that the voltage ΔV depends on the magnetic state of the spin pump as well as on that of the receiver. The magnetic state of the spin pump is determined for detecting by the interaction of the direction of the current pulse I and falling and raising flanks and an external magnetic field $H_{ext}$ acting on the spin pump. The magnetic state of the receiver in this embodiment is influenced essentially by the extent of its mechanical twist.

Since the current I does not flow through the receiver between C and D, a voltage ΔV (on the assumption of the perfect four-point measuring method) can only arise if between the contacts C and D there is a generator with an electromotive force. Here the generator is based upon the principle that a dynamic spin transfer from the spin pump generates a voltage in the receiver a voltage.

Figure 2:
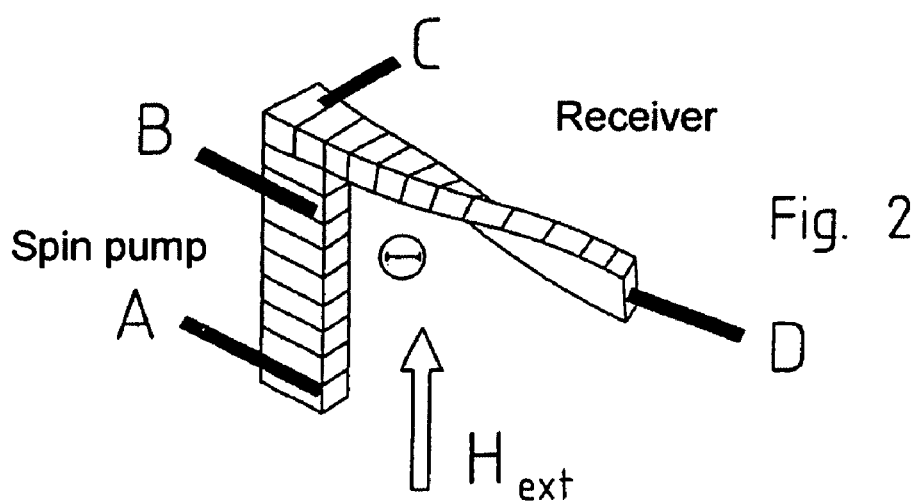
FIG. 2 shows a sensor according to invention with an angled orientation of first and second conductor section.

The FIG. 1 schematically shows the principal of the invention. However it is not necessary that the receiver is in line with the spin pump. Equally an arrangement with the spin pump set at an angle θ to the receiver is possible, as shown in FIG. 2. This arrangement is made from a flat magnetic thin strip. Crucial in this embodiment is that the spin pump and the receiver merge with each other without an interruption.

Figure 3:
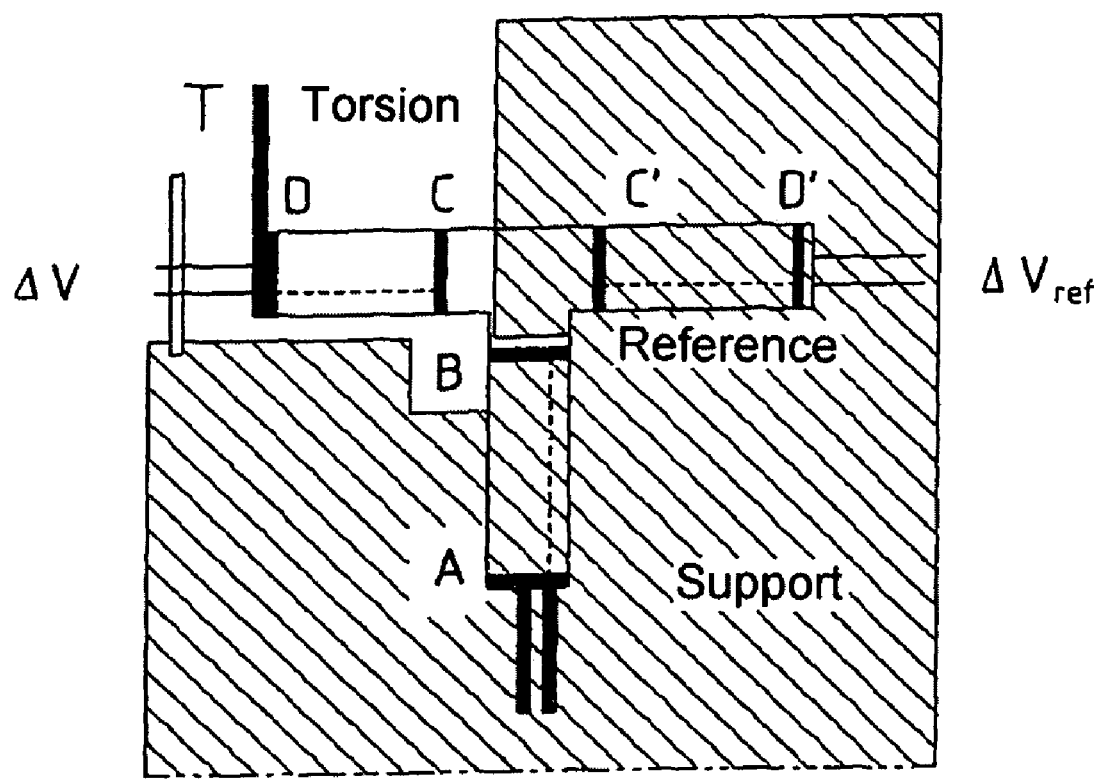
FIG. 3 shows a sensor according to invention with two second conductor sections that are arranged at a right angle respect to the first conductor section.

The spin pump can also supply several receivers that can be twisted independently from each other as shown in FIG. 3. This is of advantage for compensation of the influence of an external magnetic field. Here again the exciting voltage is applied between the contacts A and B. Measurements are taken on the one hand between C and D and on the other hand between D' and C', the latter measuring a reference signal. Hereby the spin pump and the reference receiver are mounted on a rigid substrate, whereas the other receiver is mounted flexibly and can twist. Here also the reference receiver exhibits a helical anisotropy.

The voltage ΔV not only depends on the torsion angle but also on an external magnetic field (earth field, other disturbing fields) that is superimposed on the magnetic field necessary for functioning. This unwanted property can be removed advantageously due to the special properties of the detection principle. The spin pump not only sends its signal in the direction of the receiver upward to the spin pump with reference to FIG. 1, but also downward. This means the second receiver can also extend downward symmetrically from the spin pump, or as in FIG. 3 in a T-arrangement. Also a double-T arrangement with four receivers is feasible, also arrangements with even more receivers.

Dimensions of the magnetic strip in the linear arrangement of FIG. 1 are about 10 mm×1 mm×30 μm. Current flow peak-peak is about 100 mA, voltage ΔV about 50 mV.

Figure 4:
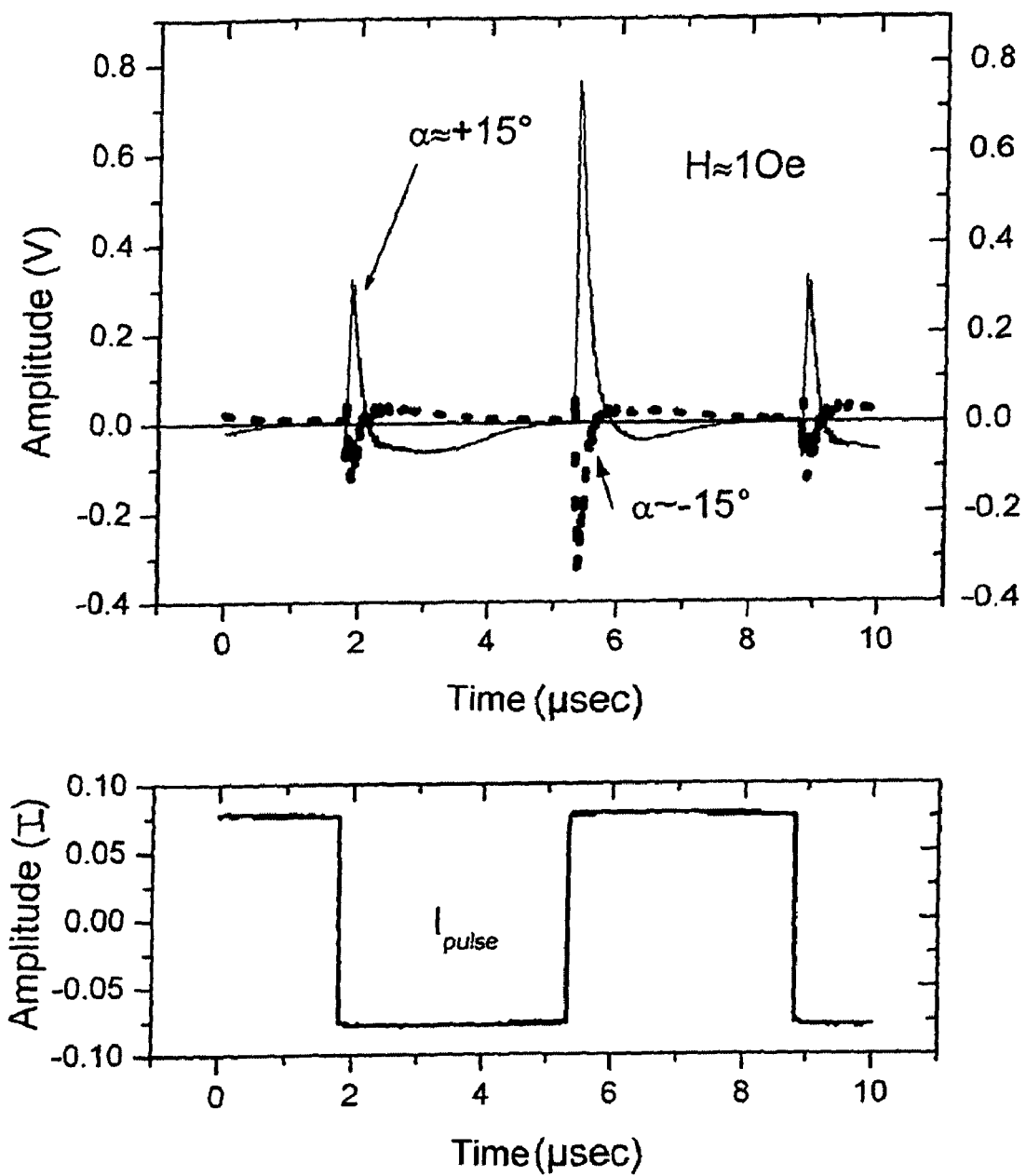
FIG. 4 shows the curve with respect to time of a measured voltage at two opposite torsions of 15 degrees relative to the exciting bipolar current pulses.

A pulse generator can produce for instance a periodic pulse sequence for powering the spin pump. FIG. 4 shows at the bottom a typical exciting bipolar pulse. The measured voltage signal ΔV (FIG. 4 top) is bipolar as well and for instance amounts after amplification to about ±800 mV. It can be recognized here that measured voltage peaks result that are positioned in time at the flanks of the exciting current pulses. It can be recognized furthermore that upon clockwise twisting by about 15 degrees a larger voltage signal results than in a measurement with twisting counter clockwise by 15 degrees. Also, the voltage signal has different polarities.

Figure 5:
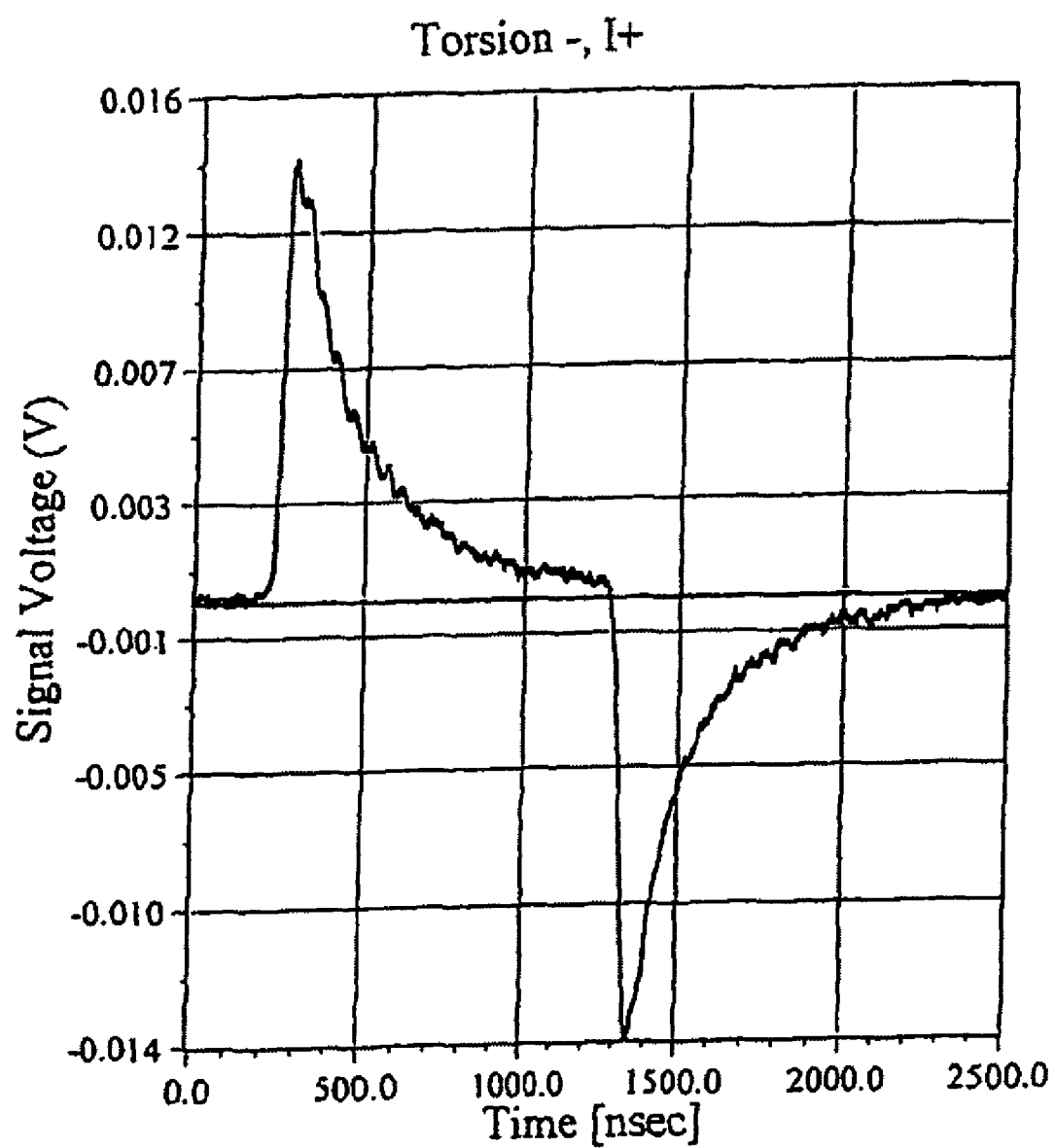
FIG. 5 shows the curve with respect to time of a measured voltage with unipolar current pulses and a given torsion.

In contrast FIG. 5 shows a measured voltage curve with a fixed external magnetic field and a unipolar pulse sequence. Again the flanks of the exciting pulse create distinct voltage pulses, now with different polarity.

After amplification, the measured voltage can be rectified and serve as measurement for the rotation angle of the torsion. The compensation against fluctuations of the surrounding magnetic field can be performed by comparison with a reference signal, for instance by subtraction of a reference signal ΔVref from ΔV or by electronic division of ΔV by ΔVref, either by analog or digital means after digitizing the signals, if for instance measurement is done in the arrangement according to FIG. 3.

Figure 6A:
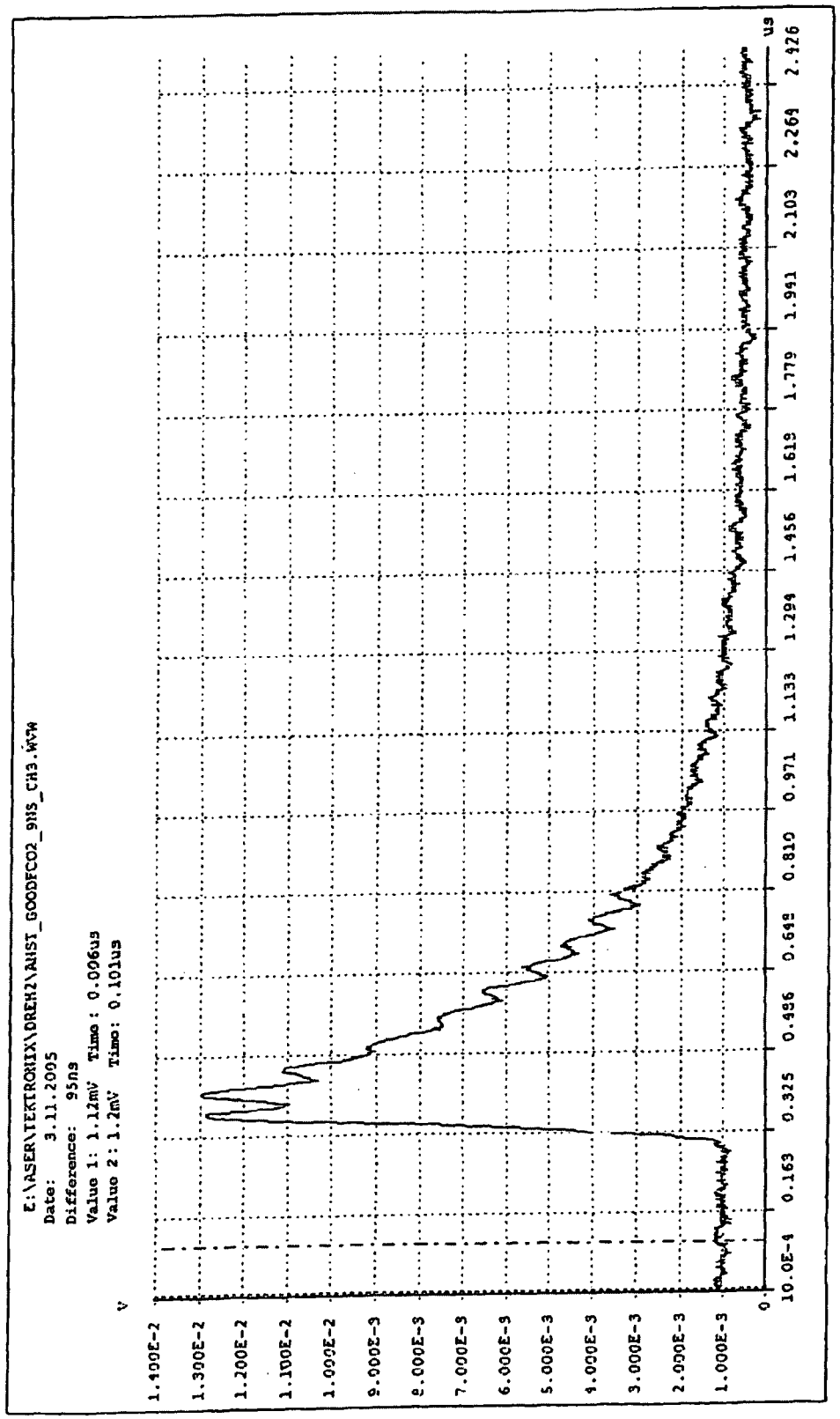
FIGS. 6-8 show the dependence of the measured voltage signal on the temporal duration of the flanks of the current pulses.
Figure 6B:
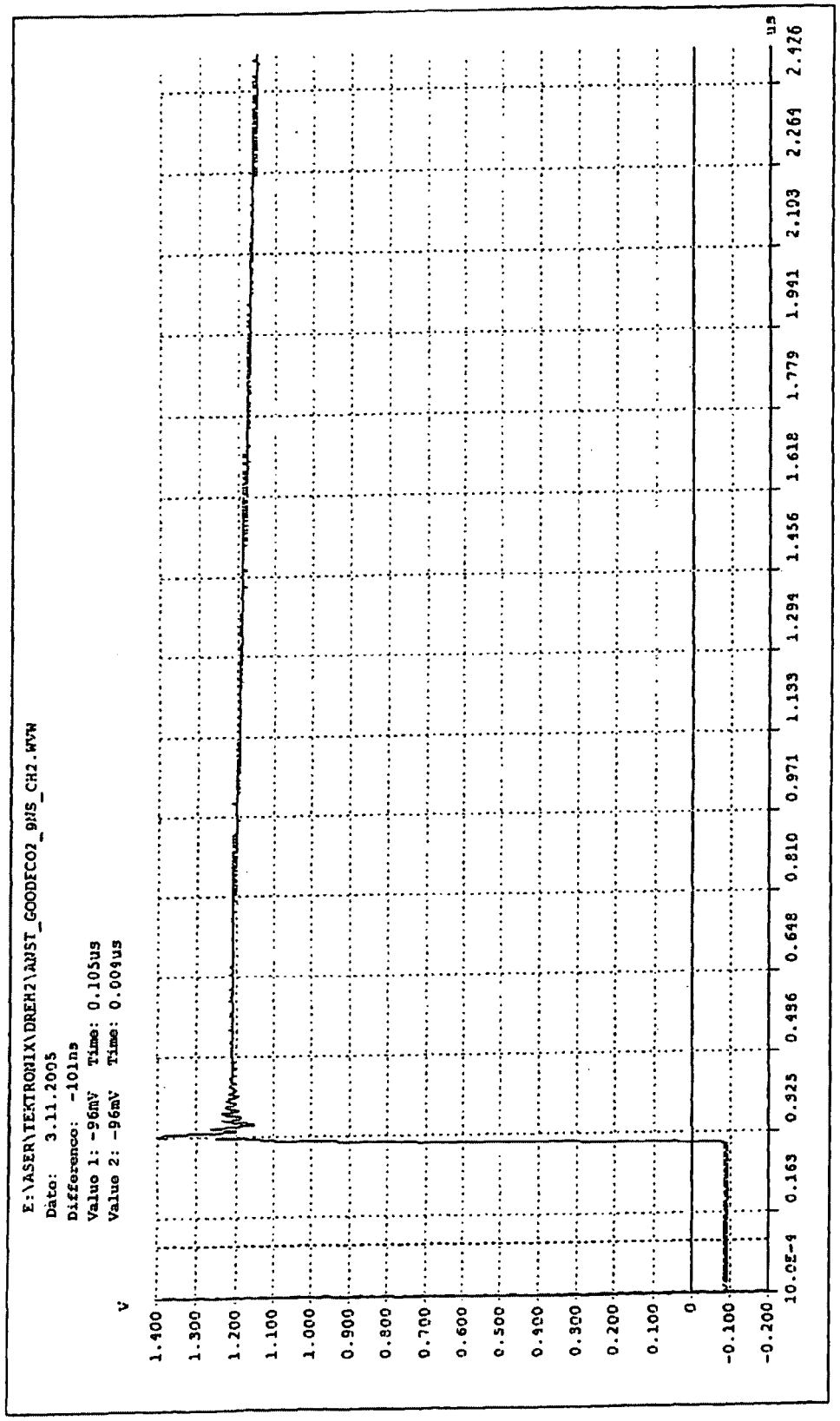

FIG. 6b shows an exciting voltage pulse for operating the spin pump with a flank steepness of about 9 nanoseconds. Possibly due to non-optimal electrical matching in the supply of the voltage pulse to the spin pump, oscillations in the measured voltage signal in the receiver (FIG. 6a) influence the quality of the measurement.

Figure 7A:
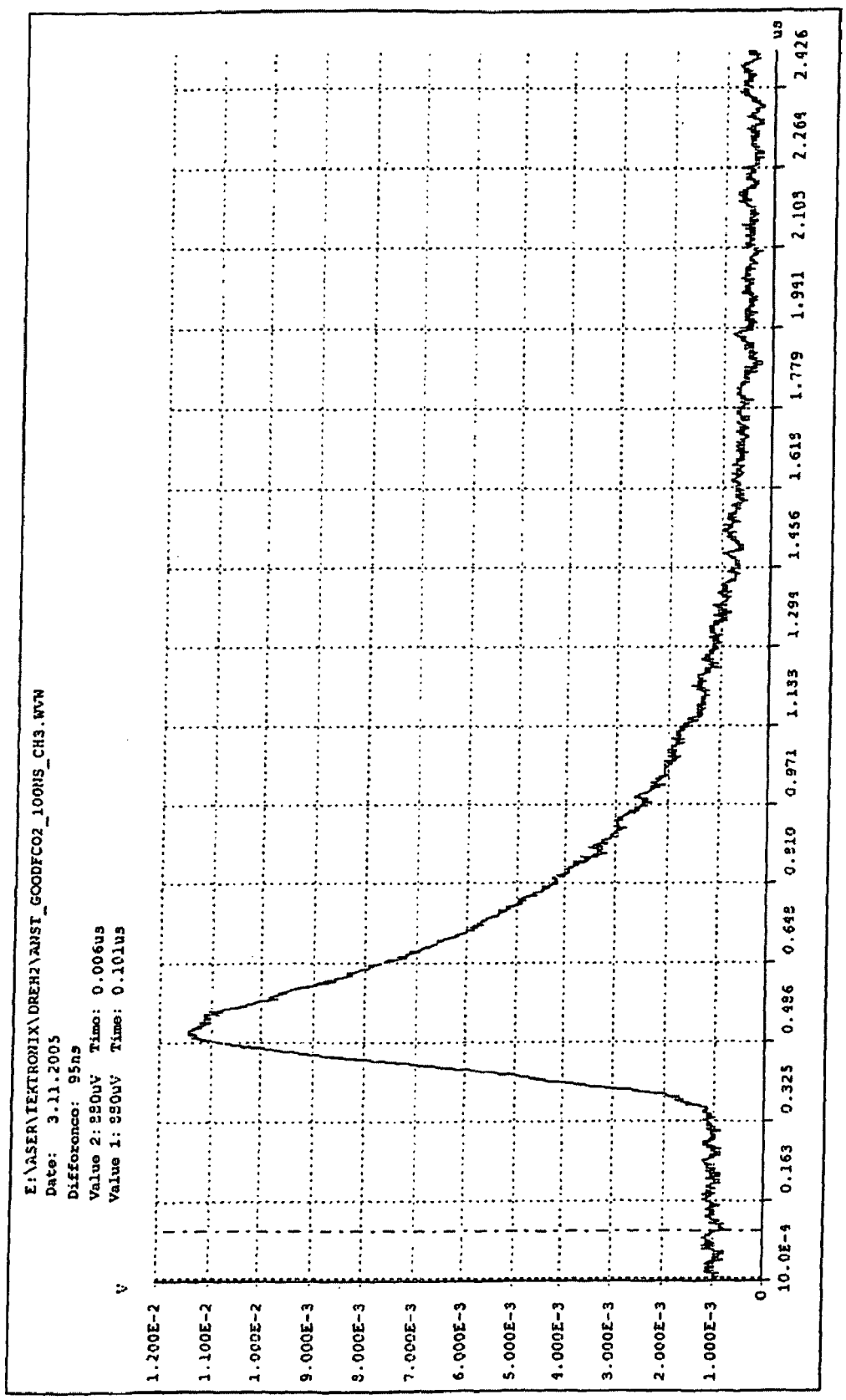
Figure 7B:
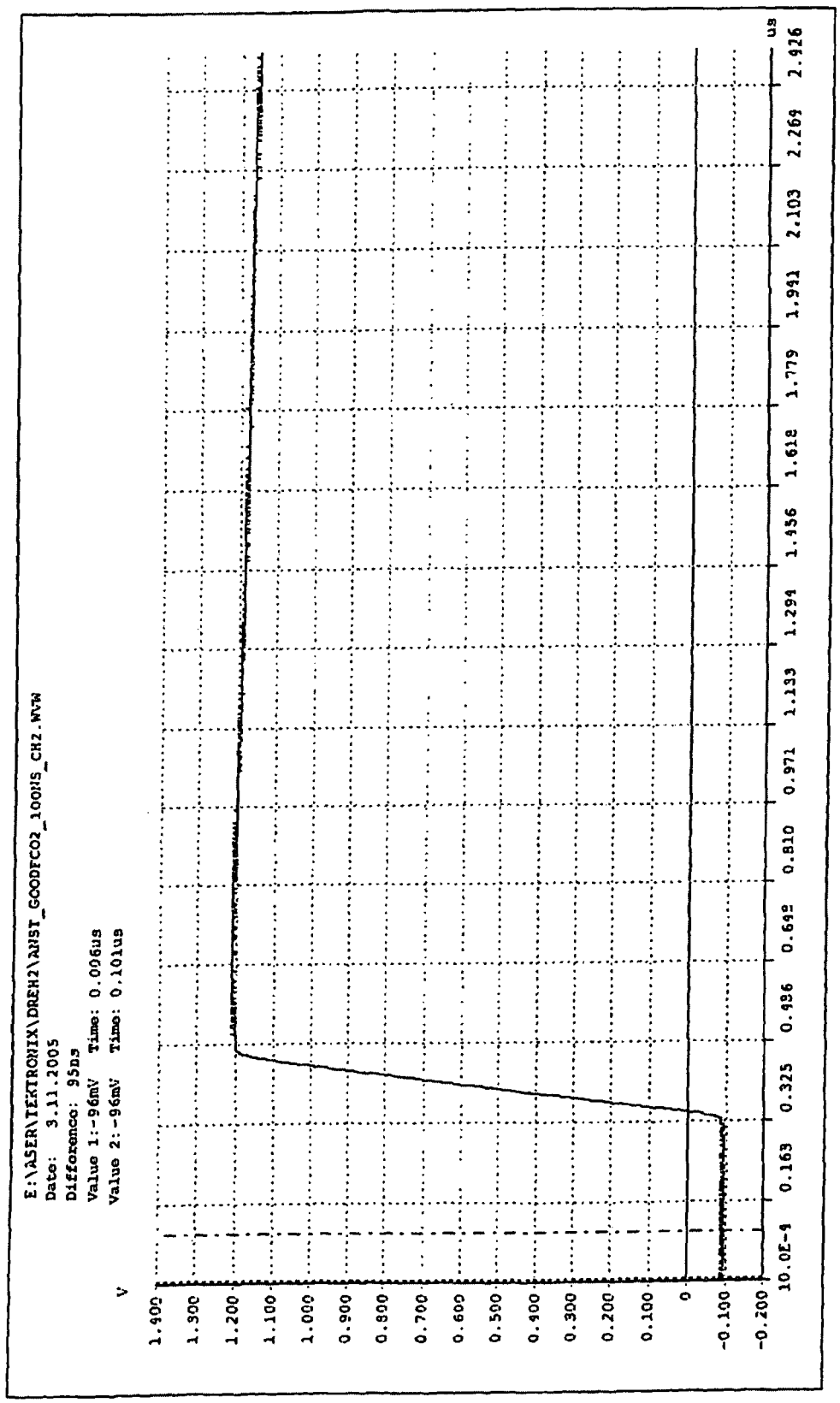

In contrast, FIG. 7b shows an exciting pulse with a flank steepness of about 100 nanoseconds. Clearly in the measured voltage signal of FIG. 7a overshoots are minimized without losing significantly signal strength.

Figure 8A:
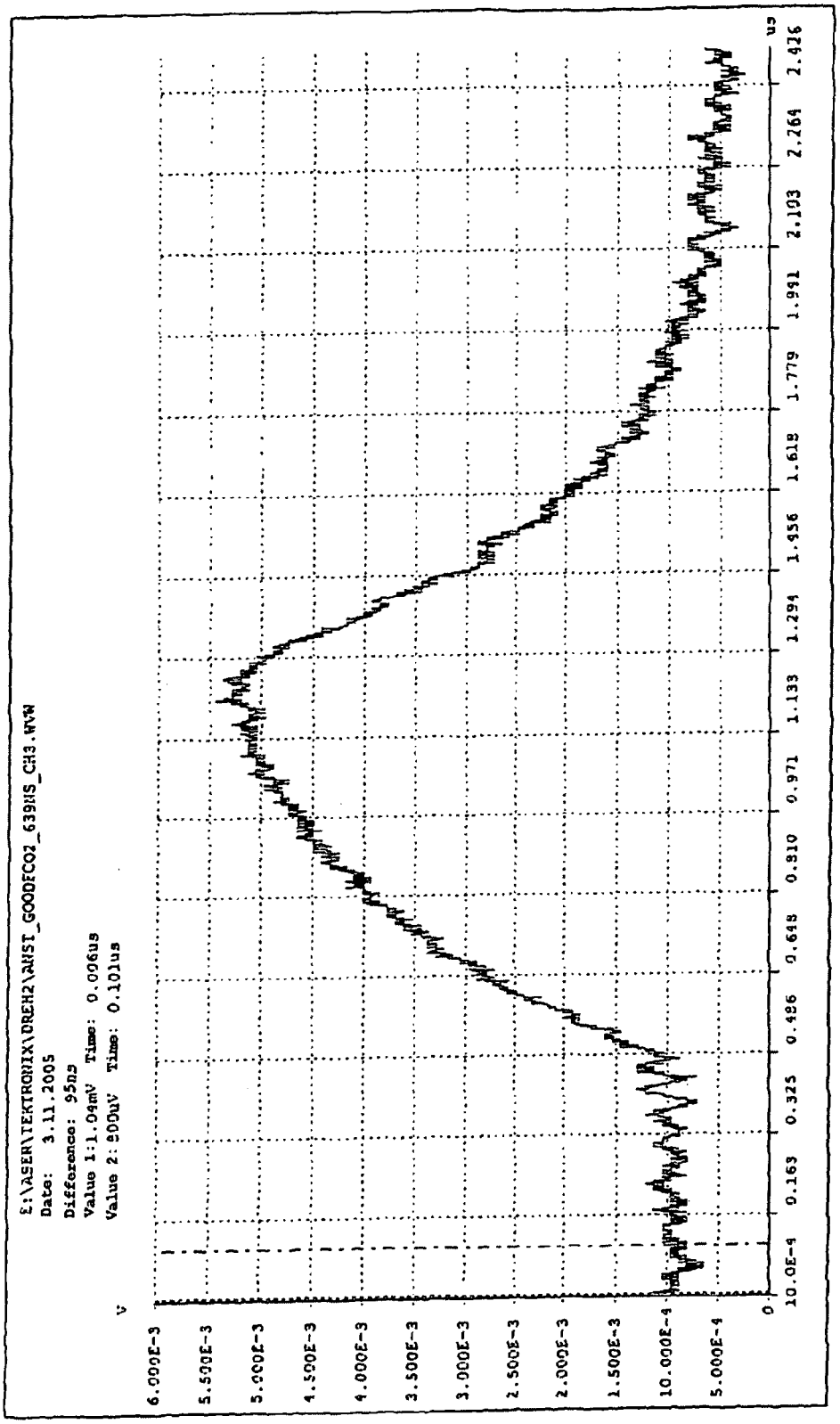
Figure 8B:
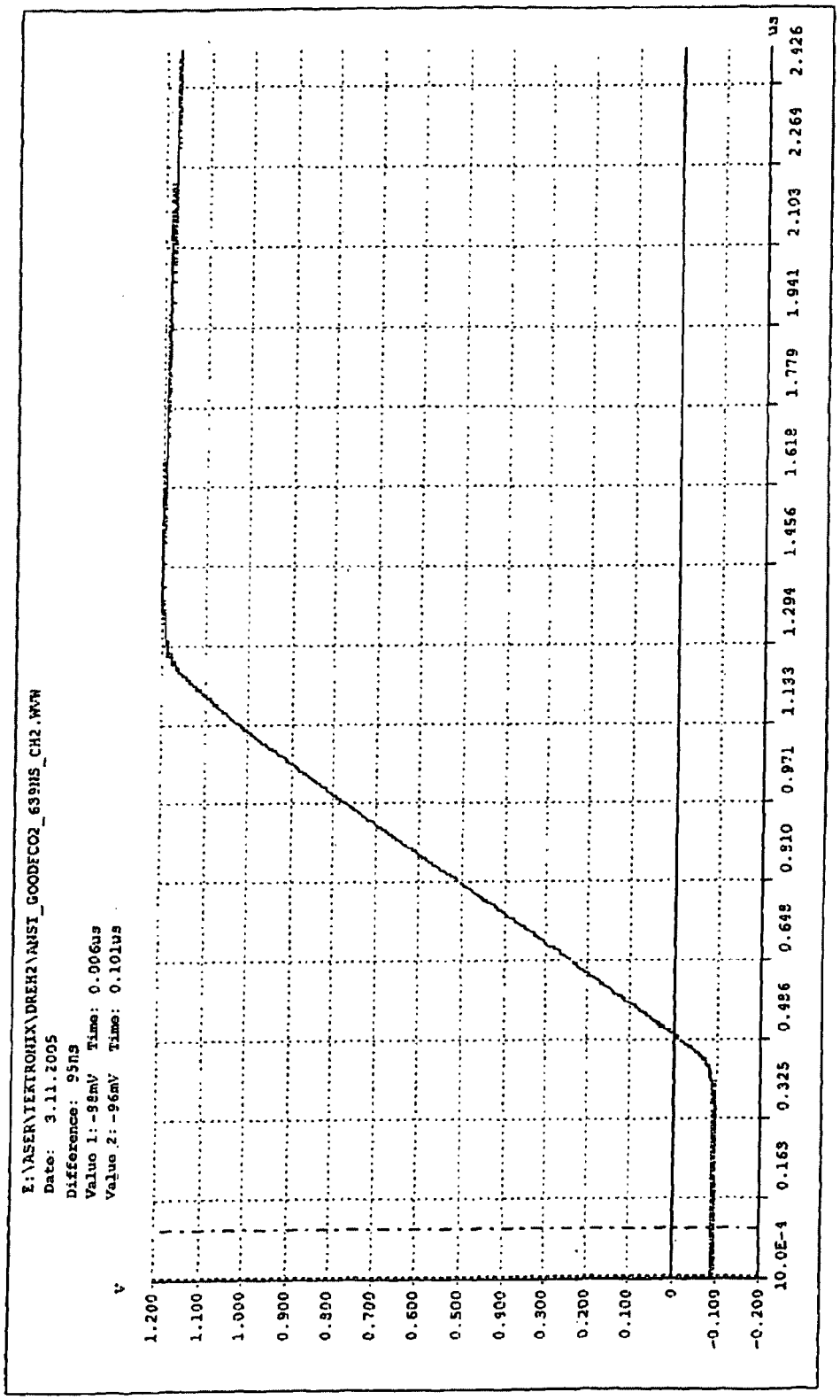

Only by further prolongation of the flank rise time to about 639 nanoseconds as shown in FIG. 8b is an amplitude loss seen in the measured signal of FIG. 8b. Accordingly it will be the aim to choose a flank rise or fall time of the current pulses through the spin pump that is optimally adjusted with respect to the signal and here is preferably in the range between 5 to 200 nanoseconds.

Figure 9:
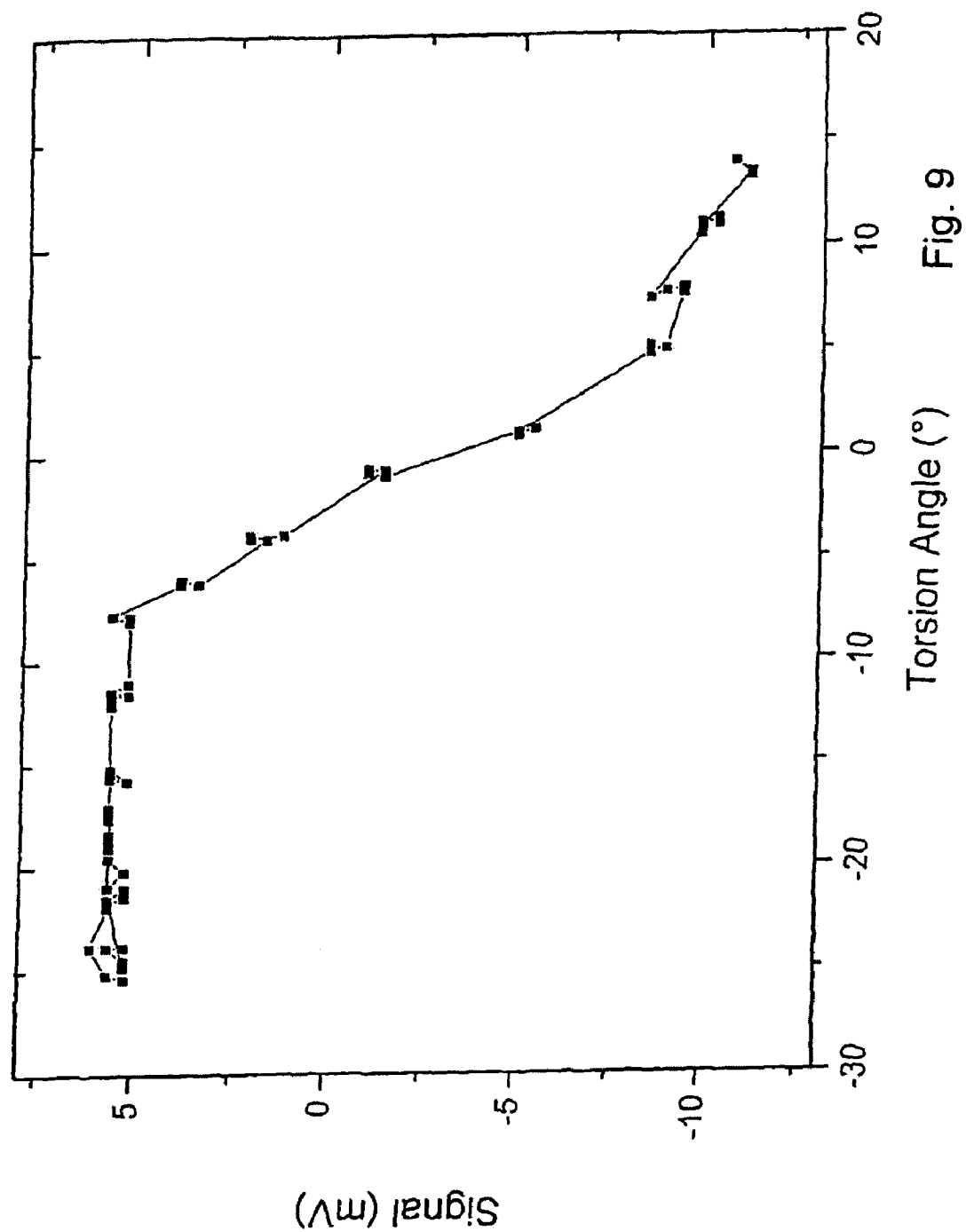
FIG. 9 shows the signal voltage with a fixed magnetic field in dependence on torsion.

FIG. 9 shows a measurement curve where the dependence of the measured voltage on the torsion angle with a constant external magnetic field is revealed. Thus it can be seen that with a sensor assembly according to invention can be a torsion-angle sensor.

Figure 10:
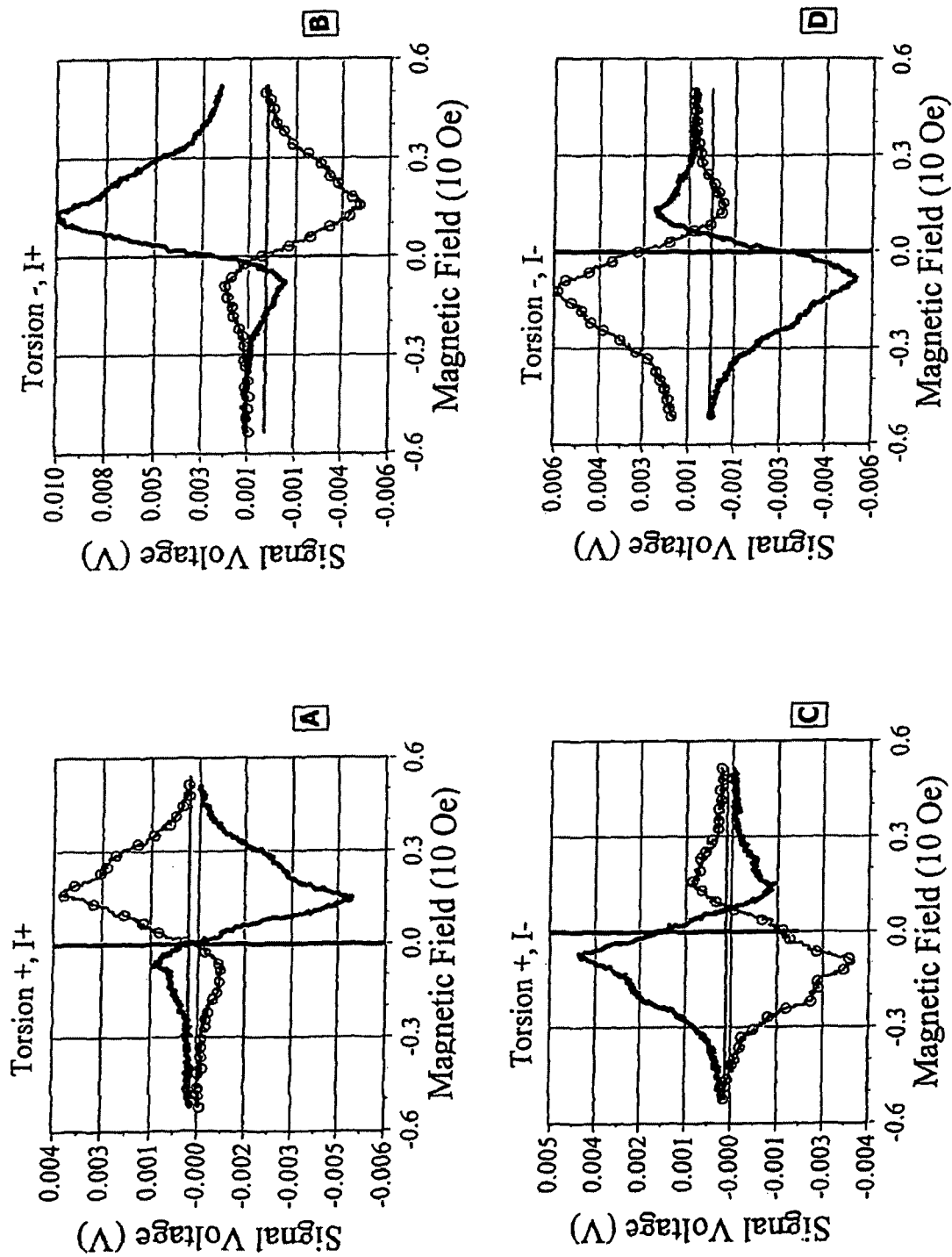
FIG. 10 shows the signal voltages in dependence on magnetic field, torsion and current pulse direction.

FIG. 10 shows in several graphs the characteristic dependence of the measured voltage signal on the applied external magnetic field as well as on torsion and the direction of the current pulse in the first conductor section. Comparison of the graphs A and B shows that upon a change of the torsion direction the magnetic-field dependent measured voltage signal effectively reverses. The dashed curves show the voltage curve at the different flanks.

Upon equal torsion and changed current direction the graphs A and C or B and D show a mirroring of the signal at the abscissa and ordinate. Particularly the dependence of the signal curve on the external magnetic field opens thereby the application as a magnetic field sensor, for instance in magnetic memory arrangements.

Figure 11:
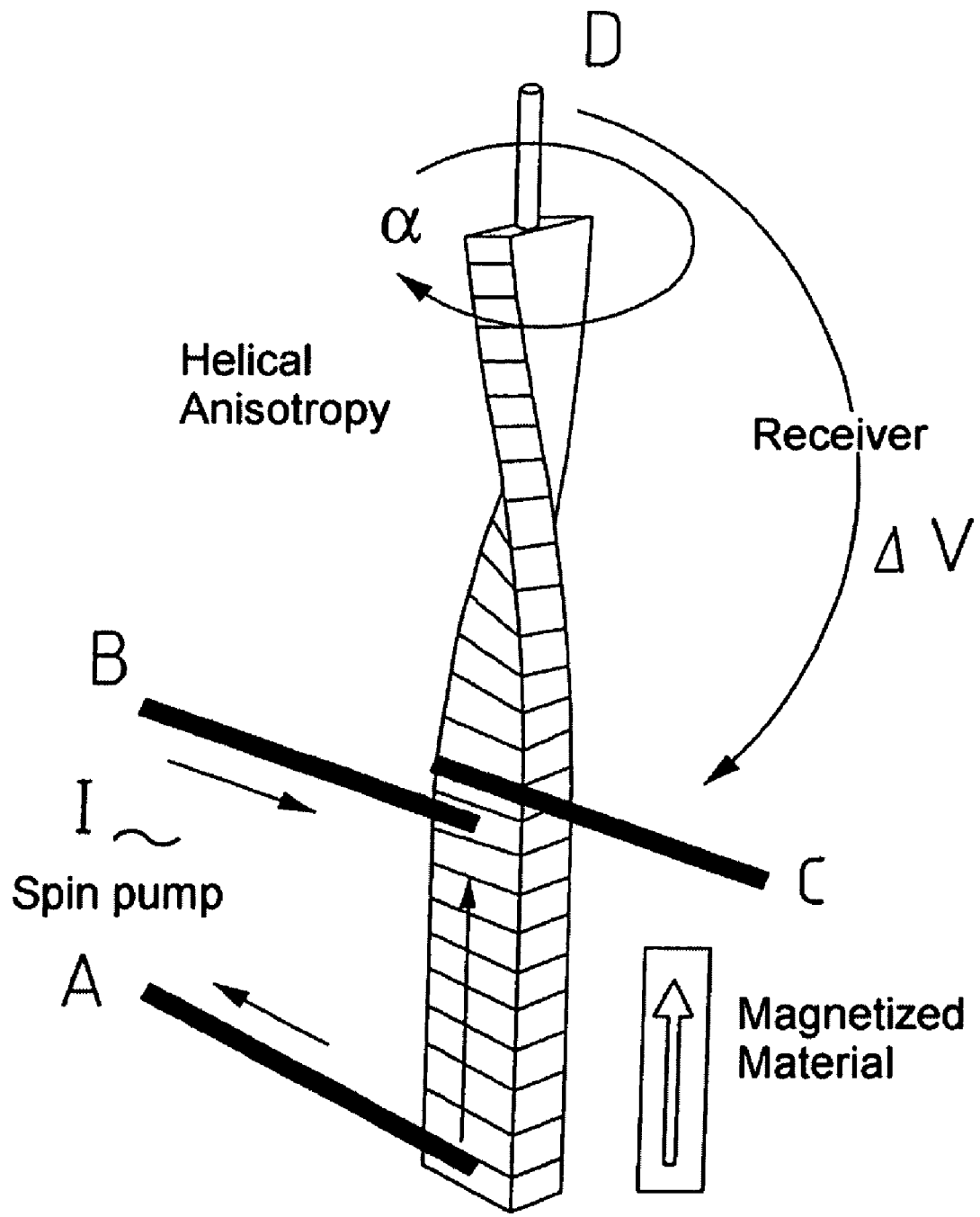
FIG. 11 shows a sensor according to invention in application as a reading device for magnetic memory.

Such an application is shown in principle in FIG. 11. The essential arrangement is as in FIG. 1, but now the top twisted part of the receiver has a static helical anisotropy that is set in this conductor section. Near the spin pump is a magnetized material whose magnetic field strength or field direction or whose basic existence or non-existence in the surroundings of the spin pump or of the whole sensor influence the measured signal.

Figure 12:
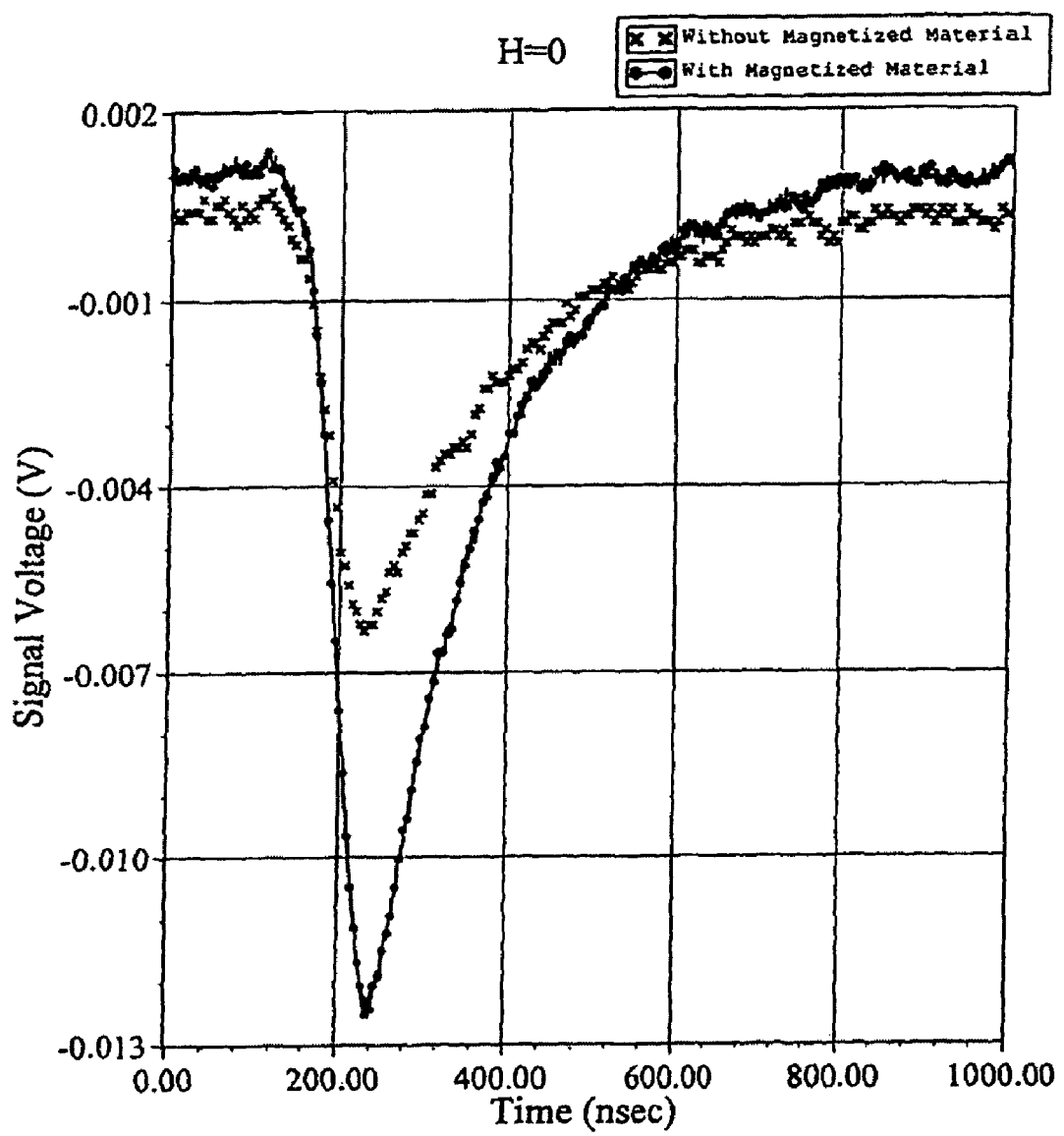
FIG. 12 shows the dependence of a signal with respect to time with or without magnetized material in the surroundings of the first conductor section.

To this basic arrangement FIG. 12 shows a voltage curve at the receiver once (thick line) in the presence of a local external magnetic field and once (thin line) in the absence of a local external magnetic field. Thus it is seen that the arrangement according to FIG. 11 can provide a reading assembly for magnetic memory. Depending on whether such a reading assembly is juxtaposed with a local external magnetic field or not or if direction or magnitude of the field changes, logical information that is coded in the magnetic field can thus be read. Clearly it can be seen here that the measured voltage signal here differs by a factor of 2 and allows a clear discrimination of the existence of the external field. Thus for instance a readout of a magnetic state of remanently magnetized data bits with help of the here described magnetic field sensor can be performed instead of other principles.

Figure 13:
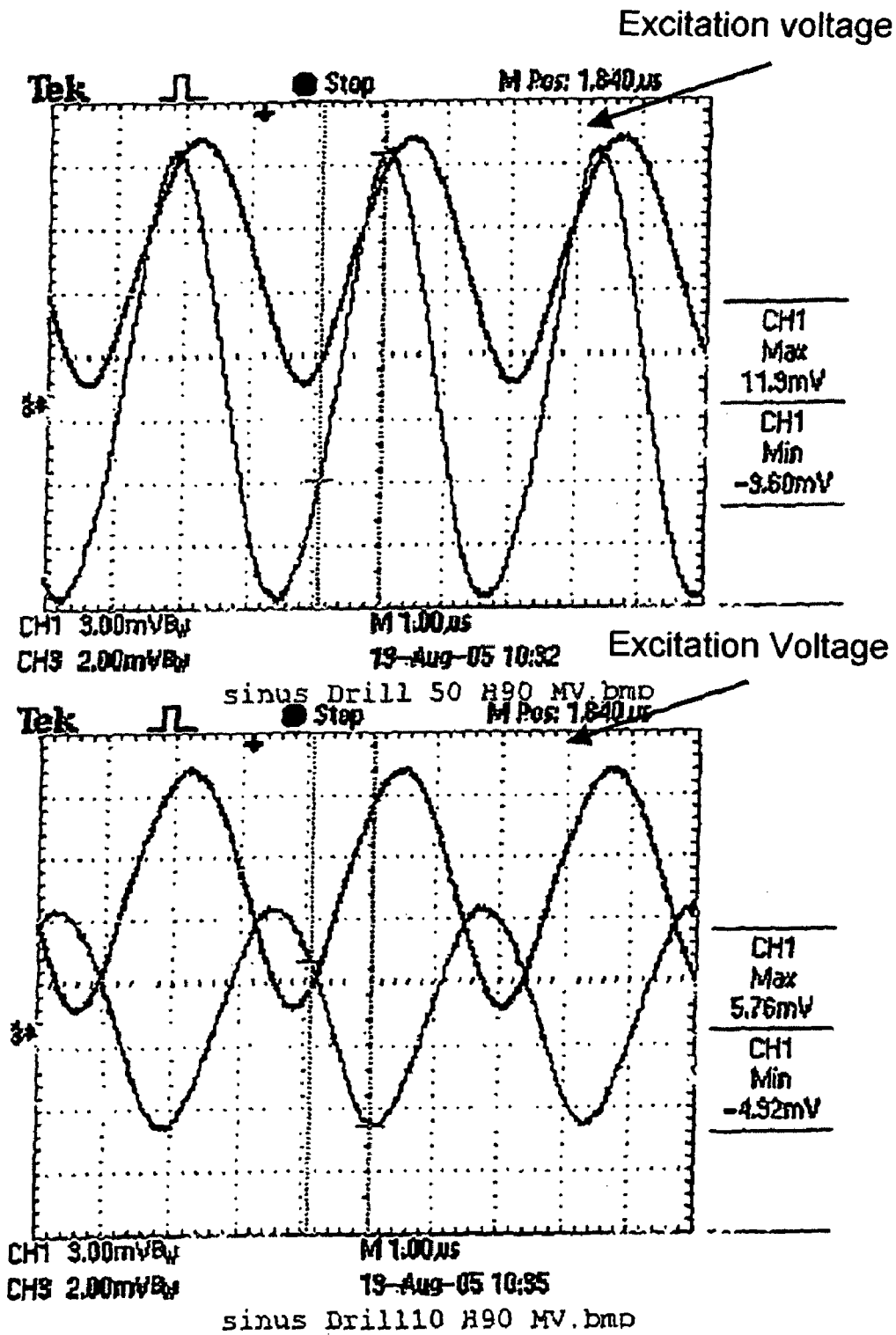
FIG. 13 shows the dependence of the phase location between exciting and measured voltage on the torsion.

FIG. 13 shows a signal curve between exciting and measured voltage of the spin pump or the receiver with a sinusoidal excitation. Here it can be recognized that the phase position of the voltages with respect to each other changes in dependence of torsion of the receiver. Thus this arrangement according to FIG. 1 can also be employed as a phase shifter. Compared to torsion of about −50 degrees a torsion of about +10 degrees results in a phase change of close to 180 degrees.

Further potential applications result for instance in the readout of the height of a scanning tip above a sample (scanning force microscope) instead of the so far common optical height determination.

Equally a torque wrench can be realized in which a measurement is performed of the twisting of a torque transmitting rod that connects the head of the wrench with the lever arm.

The invention claimed is:

1. A sensor assembly for measuring or detecting a magnetic field, torsion, or mechanical tension, the assembly comprising:
 a magnetic or magnetizable electrically conductive conductor having a first section and thereadjacent a second section in which a helical anisotropy is generated;
 means associated with the first conductor section for applying thereto an electrical current and thereby generating in the first conductor section a dynamic helical magnetization that is transferred to the second conductor section; and
 means associated with the second conductor section for detecting and measuring a voltage therein generated by the transfer of magnetization from the first conductor section.

2. The sensor assembly according to claim 1, further comprising means for generating dynamic helical magnetization in the first conductor section by passing an electric current varying with time through the first conductor section to generate therein a magnetic field that is superimposed with an external magnetic field.

3. The sensor assembly according to claim 1, wherein the first conductor section extends between a first and a second electrical contact on the conductor and the second conductor section extends between a third and a fourth electrical contact on the conductor, the first and the second conductor section not overlapping each other.

4. The sensor assembly according to claim 1, wherein the first conductor section is electrically separated from the second conductor section.

5. The sensor assembly according to claim 1, further comprising means for generating a helical anisotropy in the second conductor section by torsioning the second conductor section.

6. The sensor assembly according to claim 1, wherein helical anisotropy is in the second conductor section.

7. The sensor assembly according to claim 1, wherein one of the conductor sections is juxtaposed with a magnetic or magnetizable element.

8. The sensor assembly according to claim 1, wherein the first and the second conductor section are mounted linearly one behind the other.

9. The sensor assembly according to claim 1, wherein the first and the second conductor section are mounted at a right angle to each other.

10. The sensor assembly according to claim 1, wherein two of the second conductor sections are mounted linearly one behind the other and at a right angle to the first conductor section.

11. The sensor assembly according to claim 1, further comprising
 between the first and the second conductor section a further conductor section; and
 means for applying a steering voltage to the further conductor section, whereby the voltage measurable along the second conductor section is dependent on the steering voltage.

12. The sensor assembly according to claim 1, wherein rise or fall time of a flank of a current pulse applied by the means connected to the first conductor section is in the range of 1 to 150 nanoseconds.

13. The sensor assembly according to claim 1, wherein the first conductor section is mounted on a rigid carrier element and the second conductor section is mounted on a flexible substrate.

14. The sensor assembly according to claim 1, wherein the conductor is made from an amorphous soft iron- or cobalt-based material.

15. Using a sensor assembly according to claim 1 as a data-storage element or as a readout device for magnetic data memory or as a switching element or as a torsion meter.

16. A method for measurement or detection of magnetic fields or torsions or mechanical tensions, the method comprising the steps of:
 generating in a the first conductor section of a magnetizable or soft magnetic electrically conducting conductor a dynamic helical magnetization; and
 generating in at least a second conductor section of the conductor a helical anisotropy by transfer of magnetization from the first conductor section into the second conductor section; and
 to detecting the magnetization transferred to the second conductor section by means of a voltage generated along the second conductor section.

17. The method according to claim 16, wherein with a given helical anisotropy in at least one of the second conductor sections by the measurable voltage an external magnetic field is detected to which at least one of the conductor sections is exposed at the time of the measurement.

18. The method according to claim 16, wherein with a given dynamic helical anisotropy in the first conductor section by the measurable voltage a magnitude or direction of a torsion of the second conductor section is measured.

* * * * *